(12) United States Patent
Braceras et al.

(10) Patent No.: US 6,510,091 B1
(45) Date of Patent: Jan. 21, 2003

(54) DYNAMIC PRECHARGE DECODE SCHEME FOR FAST DRAM

(75) Inventors: George M. Braceras, Essex Junction, VT (US); Harold Pilo, Under Hill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/918,830

(22) Filed: Aug. 1, 2001

(51) Int. Cl.[7] .............................................. G11C 7/00
(52) U.S. Cl. .............. 365/203; 365/230.03; 365/230.06
(58) Field of Search ....................... 365/230.03, 230.06, 365/203, 230.08, 230.01

(56) References Cited

U.S. PATENT DOCUMENTS

| | | |
|---|---|---|
| 4,845,677 A | 7/1989 | Chappell et al. |
| 5,424,990 A | 6/1995 | Ohsawa |
| 5,542,067 A | 7/1996 | Chappell et al. |
| 5,936,873 A * | 8/1999 | Kongetira .................... 365/203 |
| 6,233,195 B1 * | 5/2001 | Yamazaki et al. ..... 365/230.03 |

* cited by examiner

*Primary Examiner*—David Lam
(74) *Attorney, Agent, or Firm*—Robert A. Walsh, Esq.; McGinn & Gibb, PLLC

(57) ABSTRACT

A dynamic random access memory includes first and second address generators, subarrays, an address decode path and a precharge activation path, wherein the precharge activation path and the address decode path are matched. The first address generator identifies a word and a column address. The second address generator identifies a subarray address. The subarrays include a number of cells for storing data. The address decode is configured to transmit address and other information while the precharge activation path is configured to transmit a precharge activation signal. In a preferred embodiment, an event during an active phase process, such as a sense amplifier set signal initiation, initiates the precharge phase process.

20 Claims, 4 Drawing Sheets

DYNAMIC PRECHARGE DECODE SCHEME FOR FAST DRAM

BACKGROUND OF THE INVENTION

1. Field of the Invention

This invention generally relates to a dynamic global precharge decode scheme for dynamic random access memory (DRAM), and more specifically to a DRAM decode scheme which includes a dynamic global precharge signal generated based on a sense amplifier set signal.

2. Description of the Related Art

DRAM memory chip systems typically have a number of units or blocks, including a first set of address generators which identify a word and a column address, second set of address generators, further referenced as RACP generators, which identify a subarray address, a number of subarrays which include a number of cells for storing data, and wiring to interconnect the various units. Signals propagate from one block to the next, such that an exit signal from a first block activates a second block.

The DRAM chips operation can be broken into two parts: an active phase, and a precharge phase. Signal transitions associated with the active phase will be referred to as active phase transitions, while those associated with the precharge phase will be referred to as precharge phase transitions.

Active phase transitions provide address and other information to a chip and causes the execution of an operation. This operation results in either a logical state being sensed from a particular cell or a particular cell being set to a high/low logical state. The active phase signal transition travels along one or more busses, such as a word/column address bus and a RACP address bus. Precharge phase transitions place the chip in a state to receive a subsequent active phase signal.

In order for the read or write operation to be successful, there must be a sufficiently long period of time between the active phase transition and the precharge phase transition, hereinafter the active signal period. However, the longer the active signal period, the slower the DRAM cycle time. Conventional static random access memory (SRAM) systems have addressed these opposite requirements of fast cycle times and long active signal duration through local and global precharging, as disclosed in U.S. Pat. No. 4,845,677, invented by Chappell et al, and assigned to International Business Machines Corporation. However, a DRAM system using a dynamic precharge signal has heretofore not been taught.

Furthermore, the conventional systems do not teach a precharge activation path matched to the address decode path, such that all cells have the same active signal period. Additionally, the conventional systems do not teach a DRAM system optimized for the active phase transition as opposed to the precharge phase transition (e.g., optimized in the forward direction), such that the active transition races through the address decode path thereby maximizing the active signal period.

SUMMARY OF THE INVENTION

In view of the above and other problems of the conventional systems and techniques, it is an object of the present invention to provide a DRAM which uses a dynamic precharge system.

It is another object of the invention to provide a DRAM in which a dynamic global precharge activation path and an address decode path are matched and a method for operating the same.

It is a further object of the invention to provide a system and method for optimizing an address path in a forward direction to gain an improvement in access time.

It is a further object of the invention to provide a system and method for providing a global decode scheme without the use of address latching by a Macro Select Not (MSN) signal.

It is a still further object of the invention to simplify a DRAM by using a single signal to activate the precharge phase of both a RACP generator and an address generator.

It is a still further object of the invention to enable a two-fold strategy for timing a start of a precharge, wherein a first strategy includes a self-timed strategy wherein the sense amplifier activation signal SETP signal triggers a precharge activation and a second strategy includes a clock-controlled strategy for conducting a margin test.

According to one embodiment of the invention, these and other objects are achieved by a DRAM including first address generators which identify a word and a column address, second address or RACP generators which identify a subarray address, a number of subarrays which include a number of cells for storing data, an address decode path configured to transmit address and other information, and a precharge activation path configured to transmit a precharge activation signal, wherein the precharge activation path and the address decode path are matched.

In a second aspect, a method includes initiating a sense amplifier signal after initiation of a word line selection signal, initiating a subarray precharge signal after initiation of the sense amplifier signal, wherein the subarray precharge signal path is matched with a subarray selection signal path, and initiating a word/column precharge signal after initiation of the sense amplifier signal, wherein the word/column precharge signal path is matched with the word/column selection signal path.

With the unique and non-obvious aspects of the present invention, it is an object of the present invention to provide a DRAM which uses a dynamic precharge system. It is another object of the invention to provide a DRAM in which a dynamic global precharge activation path and an address decode path are matched and a method for operating the same.

It is a further object of the invention to provide a system and method for optimizing an address path in a forward direction to gain an improvement in access time.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
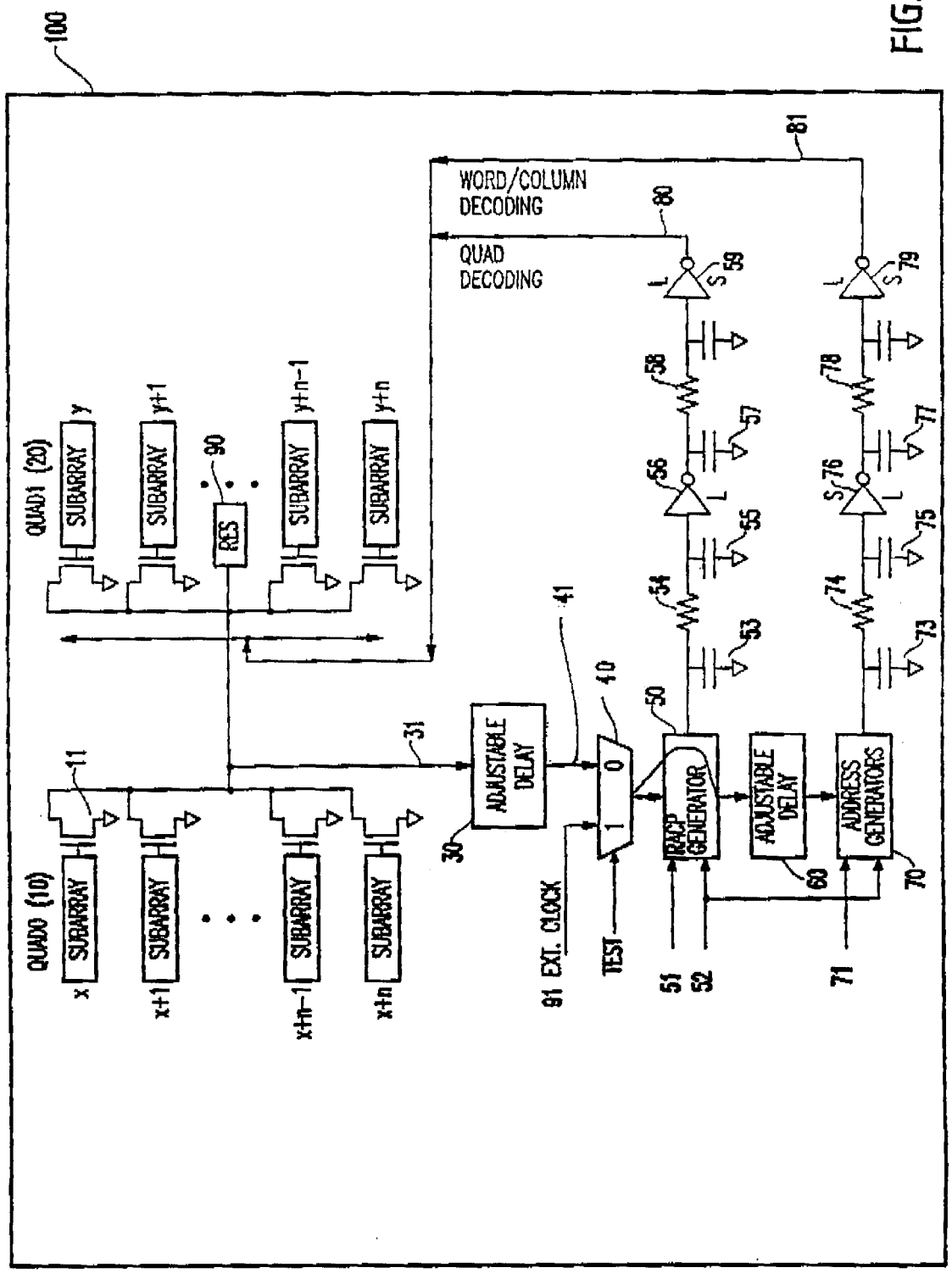
FIG. 1 is a schematic diagram of a DRAM in accordance with the present invention.

Referring now to the drawings, FIG. 1 is a schematic diagram of a DRAM 100 in accordance with the present invention.

DRAM 100 includes a first address generator 70, a second address generator, referred to as RACP generator, 50, a number of subarrays x to x+n and y to y+n, address decode paths 80 and 81, and a global precharge activation signal path 31 and 41. Each of these components will be discussed in turn.

RACP generator 50 is configured to identify a subarray address. First address generator 70 is configured to identify a word and a column address. In one embodiment, adjustable delay 60 is configured to receive a signal, such as a global precharge activation signal GLOBAL_RESTORE 41, to transmit a second signal, such as a selectively time delayed global precharge activation signal, to address generator 70. Accordingly, the signal delay between the first signal received by RACP generator 50 and address generator 70 may be micro-tuned to enhance performance, such as by ensuring that the precharge transition of the RACP signal arrives at each subarray prior to the word/column address precharge transition. The micro-tuning capability allows optimization of the margin required between turning off the RACP signal and the address row/column signals.

Address generator 70 and RACP generator 50 may be activated by read/write/refresh clocks via RD/WRT/REF CLOCKS line 52 and precharged by either GLOBAL_RESTORE line 41 or external test clock 91. GLOBAL_RESTORE line 41 causes the precharge phase activation under dynamic precharge operation, while external test clock 91 causes the precharge process activation under test operation. A multiplexer 40 may be used to determine whether GLOBAL_RESTORE line 41 or test clock 91 causes the precharge initiation.

Figure 2:
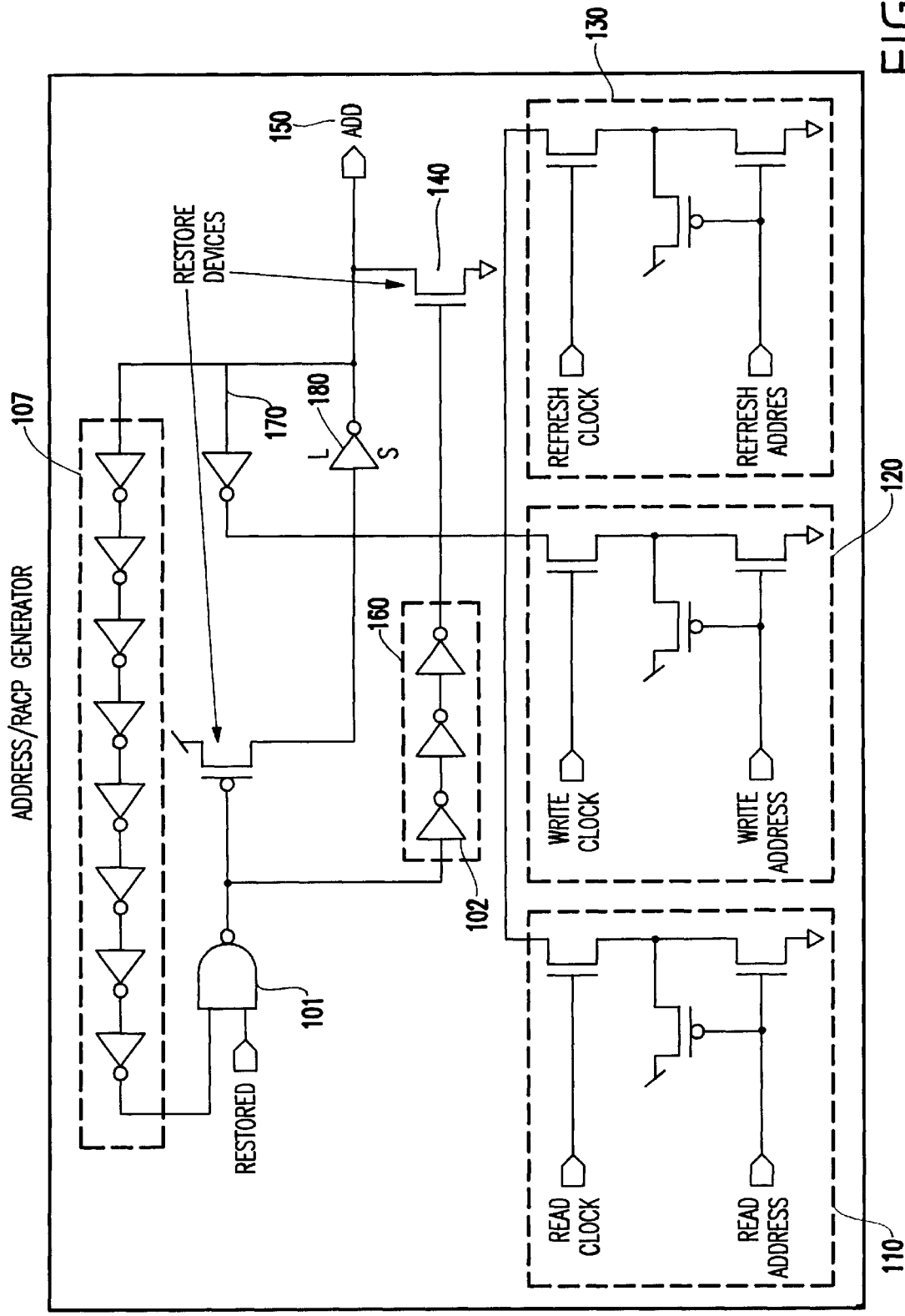
FIG. 2 is a schematic diagram of an ADDRESS/RACP generator in accordance with the present invention.

Address generator 70 and RACP generator 50 share a common architecture, as shown in FIG. 2. This architecture is essentially a conventional architecture with one primary difference. Specifically, the address/RACP generator depicted in FIG. 2 comprises a propagation delay device 107 configured to receive an address signal and transmit a delayed address signal and a restore NAND 101 gate configured to transmit a local reset signal upon receipt of the global precharge activation signal RESTORE and the delayed address signal. Accordingly, address generation does not occur until both a global precharge activation signal and a time delayed address signal is received by restore NAND gate 101. The delayed address is used as a self-timed restore signal. The NAND gate 101 requires both the self-timed restore signal and the global restore signal to be active in order to restore the address.

The NAND output is referred to as a local restore. The delay chain in FIG. 2 allows the local restore pulse width to be narrower than if only the global signal is used. The global restore signal is more capacitively loaded than the local signal, and thus cannot operate at as high a frequency. This enables the subsequent cycles active pulse to be started sooner (faster cycle time) because the address generation does not have to wait for the longer global reset pulse to turn off.

Returning to FIG. 1, a DRAM in accordance with the present invention further includes a number of subarrays x to x+n and y to y+n. X refers to subarrays from one physical region of the chip, while Y refers to subarrays from a different physical region. The dynamic global precharge scheme taught by this invention is workable for both simpler DRAM architecture, which might only have subarrays from one physical region, and for more complex structures, which might have two or more groups of subarrays.

Figure 3:
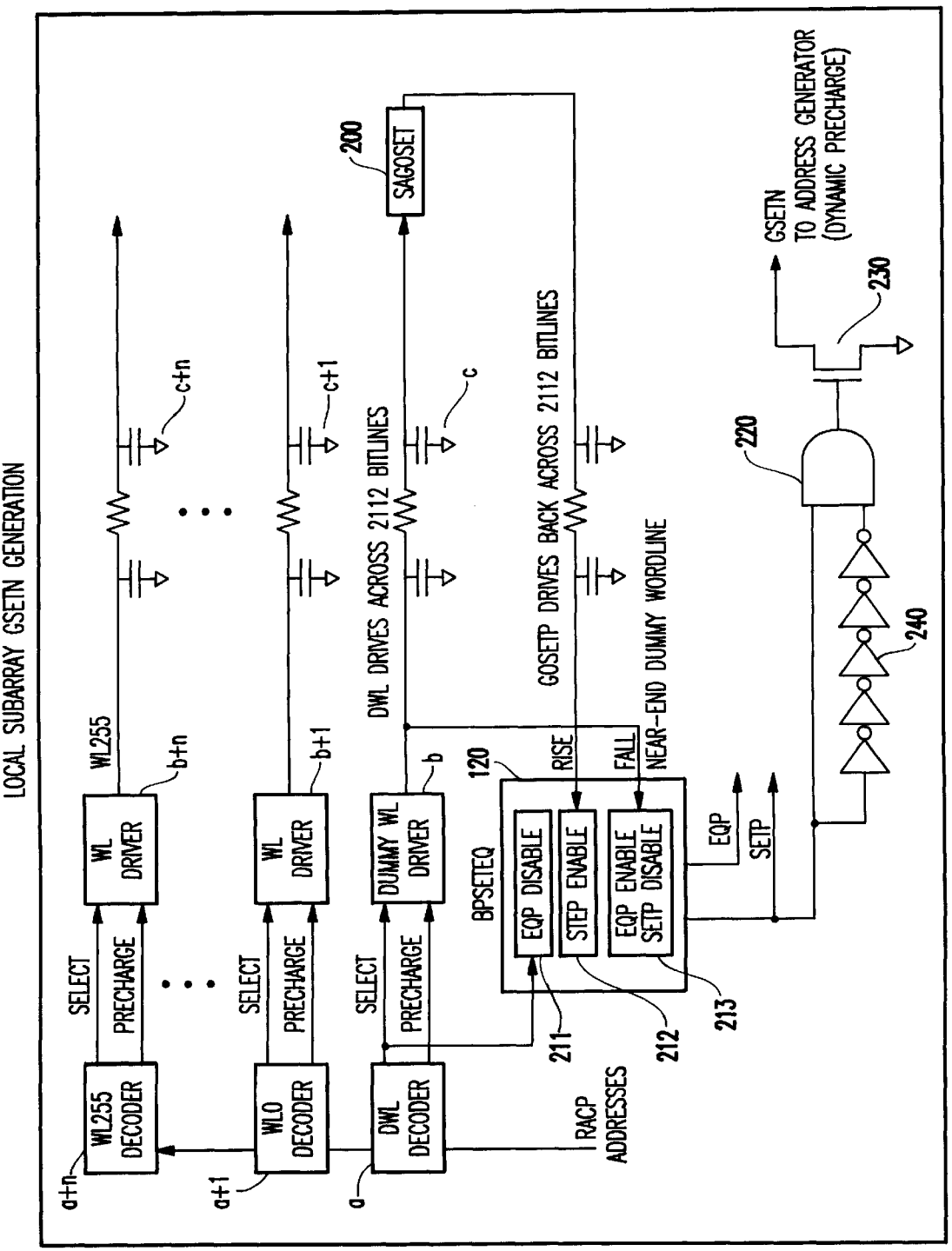
FIG. 3 is a schematic diagram of a local subarray showing the generation of a global precharge activation signal GSETN.

Each of the subarrays x to x+n and y to y+n comprises a number of cells for storing data, in accordance with conventional DRAM design, as depicted in FIG. 3. However, unlike conventional DRAMs, the present invention uses the sense amplifier set signal SETP to initiate a global precharge activation GSETN signal that, in turn, initiates the precharge process, as described in greater detail below. The initiation of the precharge process based on the SETP signal enables faster cycle and access times while still allowing a sufficiently long active signal period.

Each of the subarrays is electrically connected to the address generator 70 and the RACP generator 50. In a preferred embodiment, the subarrays may be connected to RACP generator 50 via adjustable delay 30. It is noted that each subarray includes a transistor for enabling a GSETN signal to be transmitted, as depicted by reference number 230 in FIG. 3 and reference number 11 in FIG. 1.

Returning to FIG. 1, a DRAM in accordance with the present invention further comprises an address decode paths 80 and 81 and a precharge activation path 31 and 41. Address decode paths 80 and 81 are configured to transmit an address signal with both an active phase transition and a precharge phase transition between the address generator 70, the RACP generator 50, and the subarrays. Precharge activation signal paths 31 and 41 are configured to transmit a precharge activation signal of a precharge signal process between the subarrays and both the address generator and the RACP generator.

In a preferred embodiment, the address decode path 80 and 81 and the precharge activation signal path 31 and 41 may be electrically matched, not shown in FIG. 1. The address and precharge activation signals travel the same path and are time delayed. A primary benefit of matching the address and precharge activation path is to enable a uniform active signal period regardless of the distance between RACP generator 50/address generator 70 and a particular subarray. For example, an address signal for a distant subarray that is relatively distant from RACP generator 50/address generator 70 will have a longer delay, but the precharge activation signal for the distant subarray will also have a longer delay, thereby enabling an approximately uniform signal processing period.

If the address decode and precharge activation signal paths are matched, the paths are preferably optimized in a forward direction such that the address signal active phase transitions propagation is favored over the precharge phase transition. This forward path optimization may be implemented by any conventional methodology, including the configuration shown in FIG. 1 in which inverters 56 and 76 having strong NFETs and relatively weak PFETs are followed by inverters 59 and 79 which have strong PFETs and relatively weak NFET devices. Accordingly, the active phase transition will propagate through the matched path more quickly than the precharge phase transition signal, thereby providing the least amount of time for the reading of data from a cell or writing of data to a cell.

Figure 4:
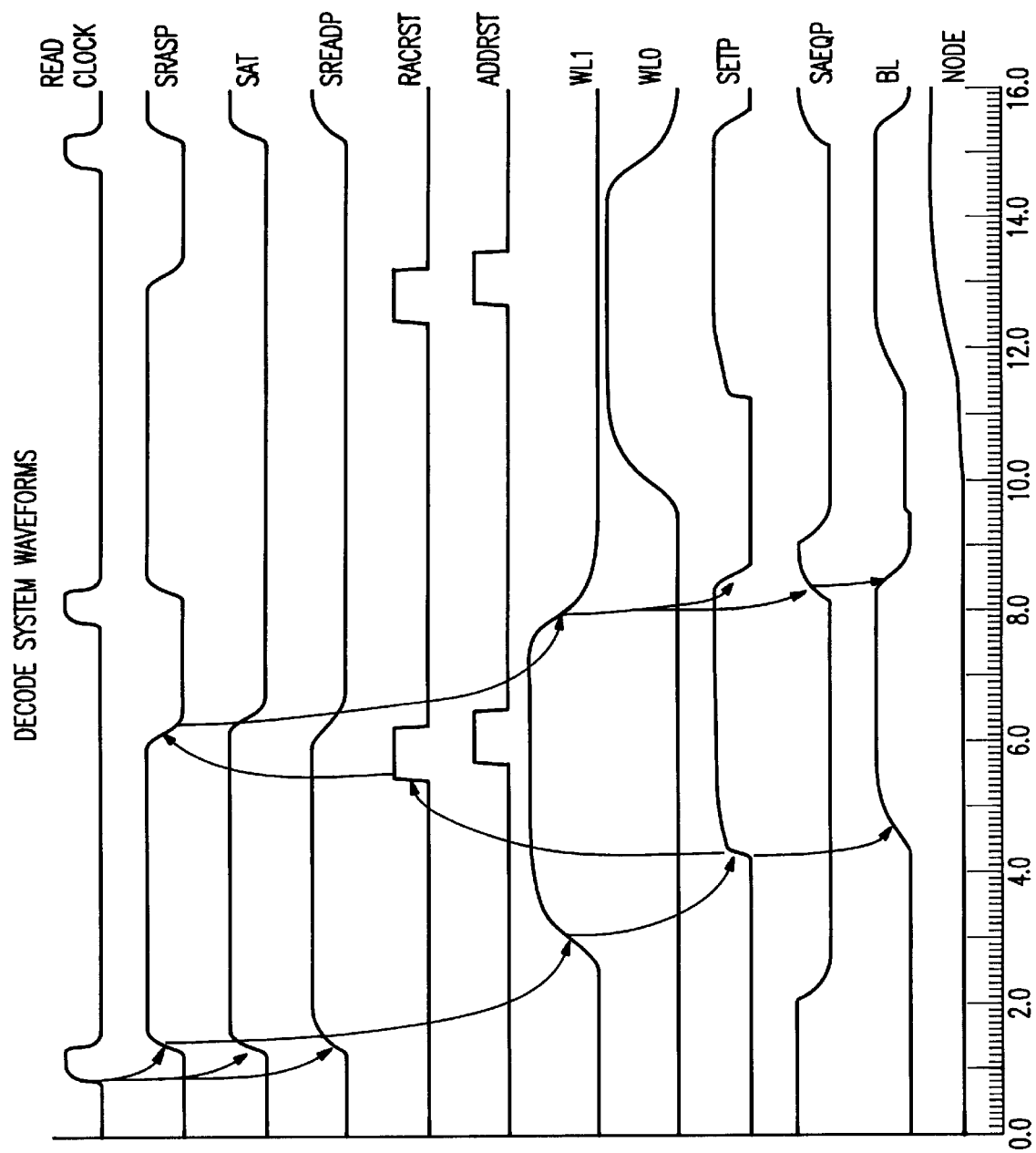
FIG. 4 is a waveform diagram in accordance with the present invention.

FIG. 4 is a waveform diagram in accordance with the present invention. Specifically, FIG. 4 provides a depiction of a read operation in accordance with the present invention. First, a read clock signal is generated. The read clock generates the rising edges of SRASP for RACP generator 50, SAT for address generator 70, and SREADP which identifies the type of operation being performed (e.g., a read operation). RACP propagates along RACP path 80 and the address signal propagates along address path 81.

The active RACP signal in conjunction with the active address signal cause a particular word line activation signal WL1 to become active. WL1, in turn, activates a sense amplifier set signal SETP. SETP causes an approximately simultaneous bitline activation signal BL and RACP precharge signal RACRST. This generation of a precharge signal based on the occurrence of a predetermined event of the active signal process, specifically the activation of SETP, provides the dynamic precharge functionality for a DRAM in accordance with the preferred embodiment of the present invention. As noted above, the RACRST may be delayed by adjustable delay 30. Similarly, RACRST may be delayed by adjustable delay 60, as shown by address precharge signal ADDRST.

RACRST additionally drives SRASP to ground, thereby preparing it for the next read operation. The precharge signal then drives WL1 to ground, which in turn resets both SETP and BL. Once SETP and BL have returned to ground, the DRAM is ready for a subsequent read operation.

While the invention has been described in terms of a preferred embodiment, those skilled in the art will recognize that the invention can be practiced with modification within the spirit and scope of the appended claims.

What is claimed is:

1. A dynamic random access memory (DRAM) comprising:
   a plurality of subarrays comprising a number of cells for storing data;
   a first address generator configured to identify a word and a column address of said subarrays;
   a second address generator configured to identify a subarray address,
   wherein each of the subarrays is electrically connected to the first address generator and the second address generator, an active phase process, and a precharge phase process;
   an address decode path configured to transmit an address of the active phase process between the fist address generator, the second generator, and the subarrays; and
   a precharge activation signal path configured to transmit a precharge activation signal for the precharge phase process, between the subarrays and the fist and second address generator circuits, wherein the initiation of the precharge phase process is based upon the occurrence of a predetermined event of the active phase process.

2. The DRAM of claim 1, wherein the precharge activation signal path and the address decode path are matched.

3. The DRAM of claim 2, wherein the precharge activation signal path and the address decode path are configured such that an active signal period is approximately the same for a first cell which is a first distance from the first address generator and a second cell which is a second distance from the second address generator.

4. The DRAM of claim 2, wherein the matched path is optimized in a forward direction such that a propagation time of an address active phase transition is smaller than a propagation time of an address precharge phase transition.

5. The DRAM of claim 1, wherein the first address generator comprises:
   a propagation delay device configured to receive a global restore signal and transmit a delayed address signal.

6. The DRAM of claim 5, wherein the first address generator comprises:
   a restore NAND gate configured to transmit a local restore signal upon receipt of the global restore signal and the delayed address signal.

7. The DRAM of claim 1, wherein the second address generator comprises:
   a propagation delay device configured to receive a global restore signal and transmit a delayed address signal.

8. The dynamic random access memory of claim 7, wherein the second address generator comprises:
   a propagation delay device configured to receive a global restore signal and transmit a delayed address signal.

9. The DRAM according to claim 1, wherein the predetermined event of the active phase signal process comprises an initiation of a sense amplifier set signal.

10. The DRAM according to claim 1, further comprising:
    a first adjustable delay configured to receive a global restore signal from the subarrays and to transmit a first selectively time delayed global restore signal to the second address generator.

11. The DRAM according to claim 10, further comprising:
    a second adjustable delay configured to receive the first selectively time delayed global restore signal from the first adjustable delay and to transmit a second selectively time delayed global restore signal to the first address generator.

12. A dynamic random access memory (DRAM) comprising:
    a plurality of subarrays comprising a number of cells for storing data;
    a first address generator configured to identify a word and a column address of said subarrays;
    a second address generator configured to identify a subarray address;
    an address decode path configured to transmit address information from the second address generator to the subarrays; and
    a precharge activation path configured to transmit a precharge signal, wherein the precharge activation path and the address decode path are physically matched.

13. The DRAM of claim 12, wherein the initiation of the precharge activation path is based upon occurrence of a sense amplifier set signal activation.

14. A method for operating a dynamic random access memory (DRAM) having a plurality of subarrays, comprising:
    initiating a sense amplifier signal after initiation of a word line selection signal;
    initiating a subarray precharge signal after initiation of the sense amplifier signal, wherein a subarray precharge signal path is matched with a subarray selection signal path; and
    initiating a word/column precharge signal after initiation of the sense amplifier signal, wherein the word/column precharge signal path is matched with the word/column selection signal path.

15. The method of claim 14, further comprising:
    initiating a type of operation signal SRASP and a column/word address signal SAT in response to the read clock signal.

16. The method of claim 14, wherein an active signal period is approximately the same for a first cell having a first signal path length and a second cell having a second signal path length.

17. The method of claim 14, wherein the timing of the subarray precharge signal and the word/column precharge signal is selectively controlled by a first adjustable delay.

18. The method of claim 17, wherein the timing of the word/column precharge signal is further selectively controlled by a second adjustable delay.

19. The method of claim 14, further comprising:

initiating a read clock signal;

initiating a subarray selection signal after the initiation of the read clock signal; and initiating the word/column selection signal after the initiation of the subarray selection signal.

20. The method of claim 14, further comprising:

initiating a write clock signal;

initiating a subarray selection signal after the initiation of the read clock signal; and initiating the word/column selection signal after the initiation of the subarray selection signal.

* * * * *